United States Patent [19]
Sahoda et al.

[11] Patent Number: 5,332,557
[45] Date of Patent: Jul. 26, 1994

[54] HEATING APPARATUS

[75] Inventors: Tsutomu Sahoda; Hideyuki Mizuki; Hidenori Miyamoto; Hisashi Hori; Hiroyoshi Sago, all of Kanagawa, Japan

[73] Assignee: Tokyo Ohka Kogyo Co., Ltd., Kanagawa, Japan

[21] Appl. No.: 5,602

[22] Filed: Jan. 19, 1993

[30] Foreign Application Priority Data

Jan. 22, 1992 [JP] Japan .................. 4-031452

[51] Int. Cl.⁵ .................. F28D 21/00; G05D 23/19; H05H 1/24
[52] U.S. Cl. .................. 422/199; 422/186.05; 422/109; 422/906; 392/416; 392/418
[58] Field of Search .................. 422/109, 186, 186.04, 422/186.05, 186.13, 186.22, 186.23, 199, 300, 307, 906; 118/724, 725, 728; 219/390; 392/416, 418

[56] References Cited

U.S. PATENT DOCUMENTS

| | | | |
|---|---|---|---|
| 4,610,628 | 9/1986 | Mizushina | 432/241 |
| 4,950,870 | 8/1990 | Mitsuhashi et al. | 219/390 |
| 4,954,684 | 4/1990 | Aoki et al. | 219/390 |
| 5,000,682 | 3/1991 | Heidt et al. | 432/241 |
| 5,080,039 | 1/1992 | Kanegae et al. | 118/725 |
| 5,171,972 | 12/1992 | Hidano | 219/390 |

Primary Examiner—Robert J. Warden
Assistant Examiner—E. Leigh Dawson
Attorney, Agent, or Firm—Irving M. Weiner; Joseph P. Carrier; Pamela S. Burt

[57] ABSTRACT

A plurality of workpieces are supported on a workpiece holder disposed over an opening defined in a horizontal base plate and connected to an evacuating device. A reaction chamber, which is supported on an arm of a lifting and lowering device, is vertically movable with respect to the base plate between a lowered position in which the reaction chamber defines a closed space which accommodates the workpieces therein and a lifted position in which the workpieces are exposed out of the reaction chamber. A heating device, which is supported on an arm of another lifting and lowering device, is vertically movable with respect to the base plate between a lowered position in which the heating device surrounds the reaction chamber and a lifted position in which the reaction chamber is exposed out of the heating device.

25 Claims, 4 Drawing Sheets

HEATING APPARATUS

BACKGROUND OF THE INVENTION

1. Field of the Invention

The present invention relates to a heating apparatus for curing a film coated on a surface of a workpiece such as a semiconductor wafer, a glass substrate, or the like.

2. Description of the Relevant Art

It has been customary to deposit a film of phosphosilicate glass (PSG) or boron silicate glass (BPSG), or a nitride film on a semiconductor wafer, or to deposit a film of silicon dioxide ($SiO_2$) on a glass substrate by first coating the surface of the semiconductor wafer or glass substrate with a coating solution of the above material and thereafter curing the coated semiconductor wafer or glass substrate with a heating device.

Heretofore, the heating device comprises a reaction chamber fixedly mounted on a base plate, a heater disposed around the reaction chamber, and a holder for holding a number of workpieces to be cured, the holder being insertable into the reaction chamber from below. In operation, the reaction chamber is evacuated to allow a solvent in the films coated on the workpieces to evaporate away, and then the workpieces are heated for curing.

The holder with a plurality of workpieces maintained therein is lifted into the reaction chamber before a curing process, and then lowered out of the reaction chamber after the curing process. Since the holder is vertically moved into and out of the reaction chamber at low speed, the overall time required to process the workpieces is lengthy.

Furthermore, the reaction chamber and heater are relatively positioned in fixed relationship. Consequently, once the temperature in the reaction chamber has increased as a result of the heating process, it does not drop quickly. When a next batch of workpieces is set in the reaction chamber and the reaction chamber is evaporated to remove the solvent by way of evaporation, a condensation reaction occurs at the same time, tending to develop cracks in the coated films.

SUMMARY OF THE INVENTION

It is therefore an object of the present invention to provide a heating apparatus which is capable of heating coated workpieces in a relatively short cycle time and of quickly lowering the temperature in a reaction chamber to allow a solvent contained in a coated film solution on the workpieces to evaporate without a condensation reaction.

Another object of the present invention is to provide a heating apparatus which can heat workpieces at a uniform temperature.

According to the present invention, there is provided a heating apparatus comprising a base plate having an opening defined therein which is connected to an evacuating device, a workpiece holder disposed over the opening for holding workpieces, a reaction chamber vertically movable with respect to the base plate between a lowered position in which the reaction chamber defines a closed space which accommodates the workpieces therein and a lifted position in which the workpieces are exposed out of the reaction chamber, and a heating device vertically movable with respect to the base plate between a lowered position in which the heating device surrounds the reaction chamber and a lifted position in which the reaction chamber is exposed out of the heating device.

According to the present invention, there is also provided a heating apparatus for heating workpieces, comprising holder means for holding workpieces, a reaction chamber for accommodating the holder means with the workpieces held thereby, the reaction chamber being movable to a position in which the workpieces are exposed out of the reaction chamber, and heater means for heating the reaction chamber in covering relationship thereto, the heater means being movable to a position in which the reaction chamber is exposed out of the heater means.

The above and further objects, details and advantages of the present invention will become apparent from the following detailed description of a preferred embodiment thereof, when read in conjunction with the accompanying drawings.

DETAILED DESCRIPTION OF THE PREFERRED EMBODIMENT

Figure 1:
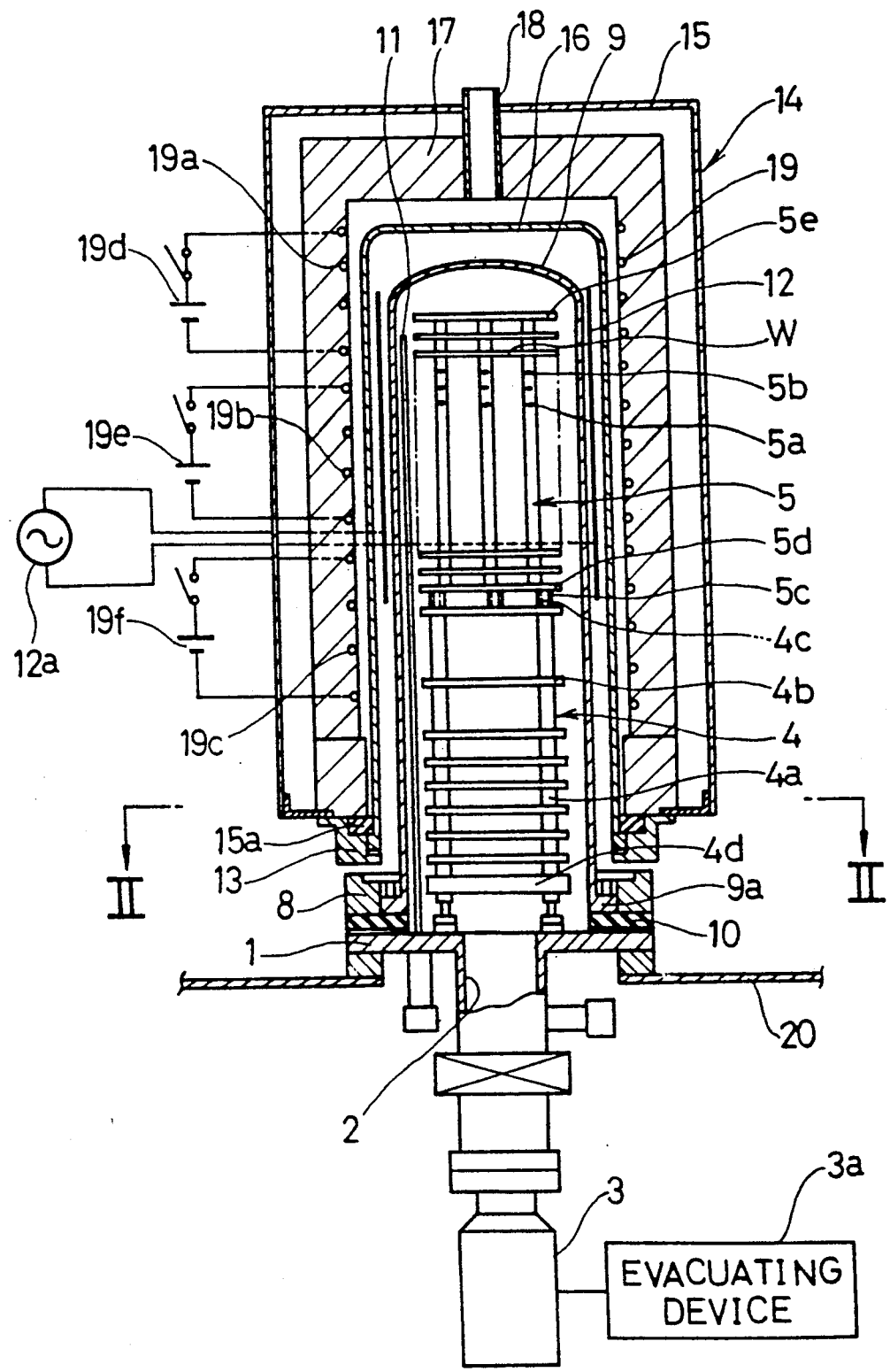
FIG. 1 is a vertical cross-sectional view of a heating apparatus according to the present invention, with a heating device and a reaction chamber being shown as lowered.

As shown in FIG. 1, a heating apparatus according to the present invention has a horizontal base plate 1 mounted on a horizontal support panel 20. The base plate 1 has an opening 2 defined therein which is connected to a vertical pipe 3 that is connected at its lower end to an evacuating device 3a. A support frame 4 of synthetic quartz or aluminum is fixedly positioned on the base plate 1 over the opening 2. A workpiece holder 5 of synthetic quartz or aluminum is removably mounted on an upper end of the support frame 4.

The support frame 4 comprises four spaced vertical columns 4a mounted on a lower base 4d placed on the base plate 1, and a plurality of vertically spaced horizontal plates 4b attached to the vertical columns 4b. The horizontal plates 4a are spaced more widely in an upper region of the support frame 4 than in a lower region thereof for achieving a uniform temperature distribution in the support frame 4.

The workpiece holder 5 comprises four spaced vertical columns 5a having lower ends mounted on a lower base 5d and upper ends connected by an upper base 5e. The vertical columns 5a are positioned at respective four vertices of a trapezoidal shape in a horizontal plane. Each of the vertical columns 5a has a number of vertically spaced horizontal grooves 5b. The horizontal grooves 5b of the vertical columns 5a are open toward the center of the workpiece holder 5 for Jointly receiving peripheral edges of vertically spaced workpieces W such as semiconductor wafers, glass substrates, or the like. Therefore, the workpieces W are supported in vertically spaced relationship by the vertical columns 5a.

The support frame 4 has three horizontally spaced positioning teeth 4c on the upper surface of its uppermost plate 4b that is joined to the upper ends of the vertical columns 4a. The lower base 5d of the workpiece holder 5 has three horizontally spaced collars 5c on its lower surface. The collars 5c are snugly fitted over the positioning teeth 4c, respectively, thereby positioning and setting the workpiece holder 5 on the support frame 4. One of the positioning teeth 4c may be of a different length or diameter than the other positioning teeth 4c, so that it snugly fits in only a particular one of the collars 5c for orienting the workpiece holder 5 in a particular direction.

Figure 2:
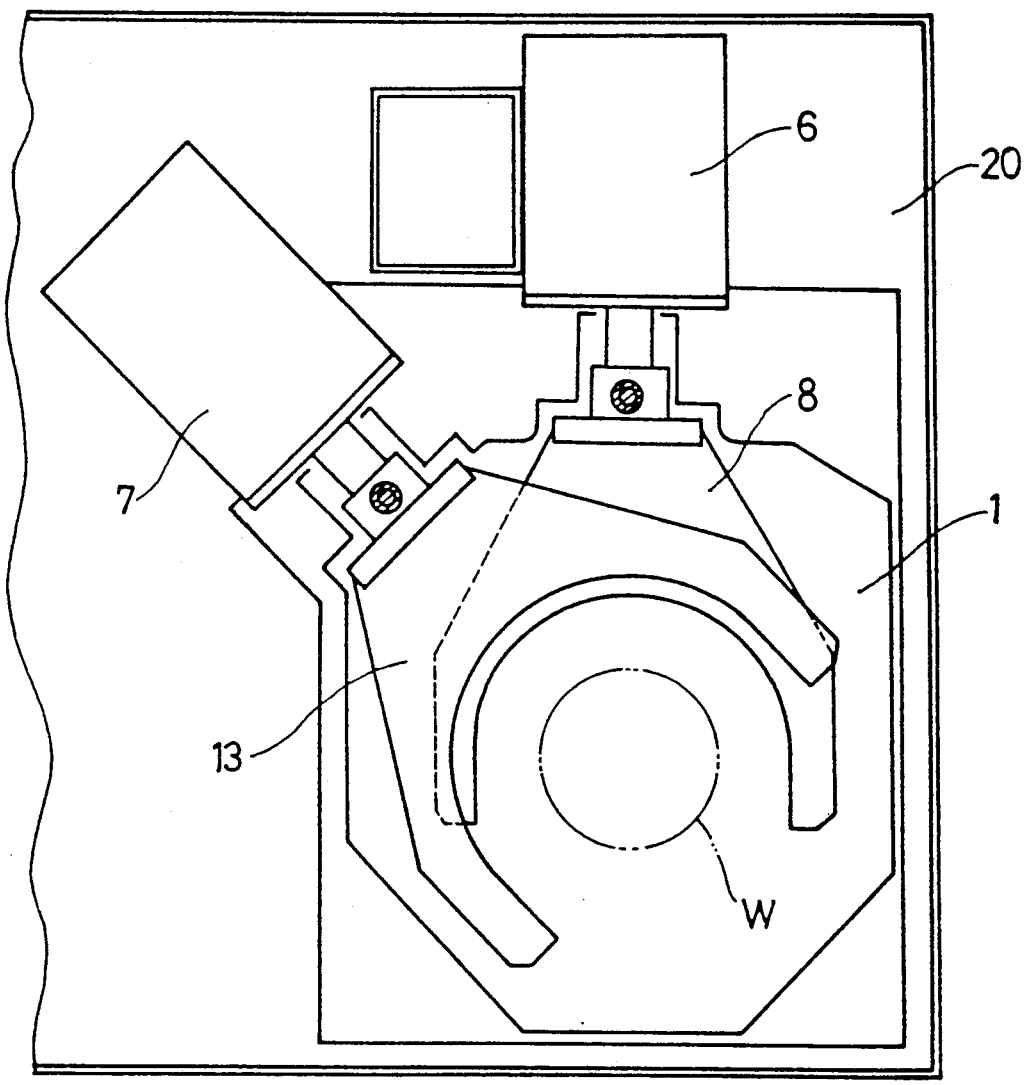
FIG. 2 is a cross-sectional view taken along line II—II of FIG. 1.

As shown in FIG. 2, the heating apparatus also includes a pair of lifting and lowering devices 6, 7 mounted on the support panel 20 and having respective arms 8, 13 which are vertically movable. Each of the arms 8, 13 is of a bifurcated configuration and extends over the base plate 1 as also shown in FIG. 1. The arm 8 of the lifting and lowering device 6 supports thereon a bell-jar reaction chamber 9 (see FIG. 1) made of synthetic quartz or the like. The reaction chamber 9 has a closed upper end and an open lower end including a radially outward flange 9a placed on an annular seal 10 secured to the lower surface of the arm 8. The reaction chamber 9 is thus vertically movable with the arm 8. When the reaction chamber 9 is moved to a lowered position, the seal 10 is pressed against the upper surface of the base plate 1, and the reaction chamber 9 and the base plate 1 jointly define a closed space that accommodates the support frame 4 and the workpiece holder 5 therein. When the reaction chamber 9 is moved to a lifted position, it is elevated clear of the workpiece holder 5 on the support frame 4, exposing the workpiece holder 5 out of the reaction chamber 9 to an outer space.

A vertical thermocouple 11 is supported at its lower end on the base plate 1 such that the thermocouple 11 is placed within the closed space in the reaction chamber 9 when it is in the lowered position. Electrodes 12 coupled to a high-frequency power supply 12a are disposed around the reaction chamber 9 for generating a plasma in the reaction chamber 9 when energized by the high-frequency power supply 12a.

Figure 4:
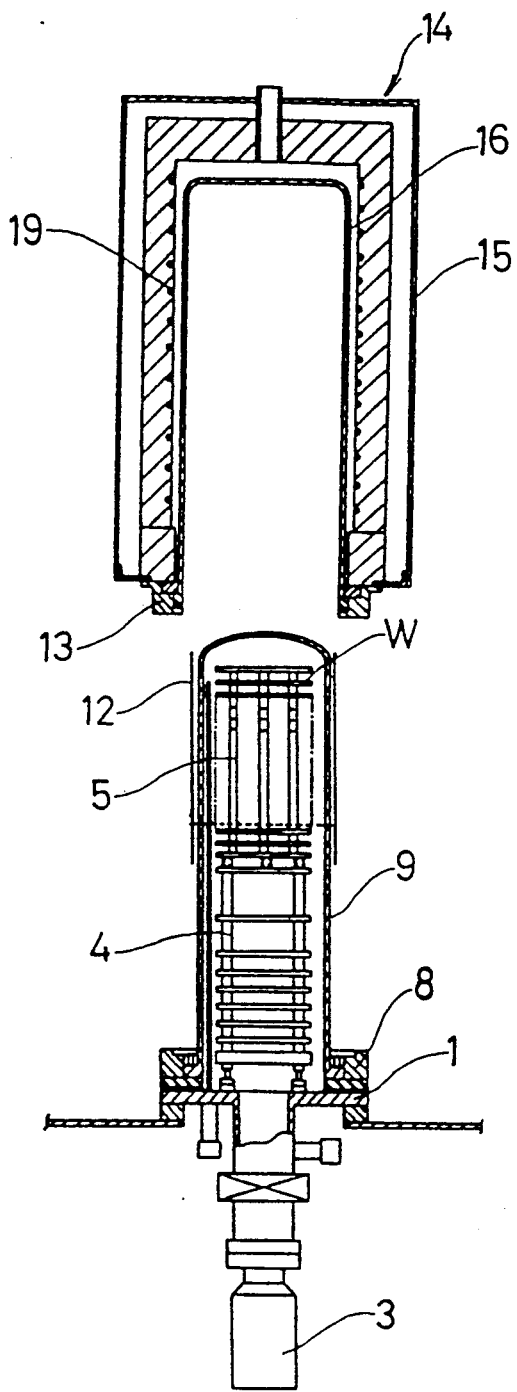
FIG. 4 is a vertical cross-sectional view of the heating apparatus with only the heating device being shown as lifted.

The heating apparatus further includes a heating device 14 whose lower end is supported on the arm 13 of the lifting and lowering device 7. The heating device 14 is thus vertically movable with the arm 13. When the heating device 14 is lowered, it covers the reaction chamber 9 as shown in FIG. 1. When the heating device 14 is elevated, it can be positioned clear of the reaction chamber as shown in FIG. 4. The heating device 14 comprises an outer case 15 of stainless steel, an inner case 16 of synthetic quartz disposed in the outer case 15 in spaced relationship thereto, and a thermally insulating board 17 positioned between the outer and inner cases 15, 16. The outer and inner cases 15, 16 have lower ends connected to each other through an annular seal 15a. The space between the thermally insulating board 17 and the inner case 16 communicates with an outer space around the outer case 15 through a vertical cooling duct 18 extending through upper ends of the thermally insulating board 17 and the outer case 15. The heating device 14 has a coiled heater 19 embedded in an inner circumferential surface of the thermally insulating board 17.

The heater 19 comprises three independently controllable heater segments 19a, 19b, 19c that are positioned respectively in vertically spaced upper, middle, and lower regions of the heating device 14. The heater segments 19a, 19b, 19c are connected to respective DC power supplies 19d, 19e, 19f. Since the interior of the heating device 14 is progressively cooler in the downward direction, the heater segment 19c is energized with more electric energy than the heater segment 19a for achieving a uniform the temperature in the heating device 14 according to the invention.

The workpiece holder 5 is placed on the support frame 4 so that the workpieces W supported by the workpiece holder 5 can be heated in the upper region of the reaction chamber 9 in which the temperature is more uniform.

The heating apparatus operates to cure the workpieces W (or the films thereon) supported on the workpiece holder 5 while the reaction chamber 9 and the heating device 14 are in lowered positions thereof. More specifically, before the workpieces W are cured, the reaction chamber 9 is evacuated to remove the solvent from the coated wet film on the workpieces W by way of evaporation. Thereafter, the workpieces W are heated by the heating device 14 when the heater segments 19a, 19b, 19c are energized by the respective DC power supplies 19d, 19e, 19f. The workpieces W may be cured in a plasma atmosphere which is generated by the electrodes 12.

Figure 3:
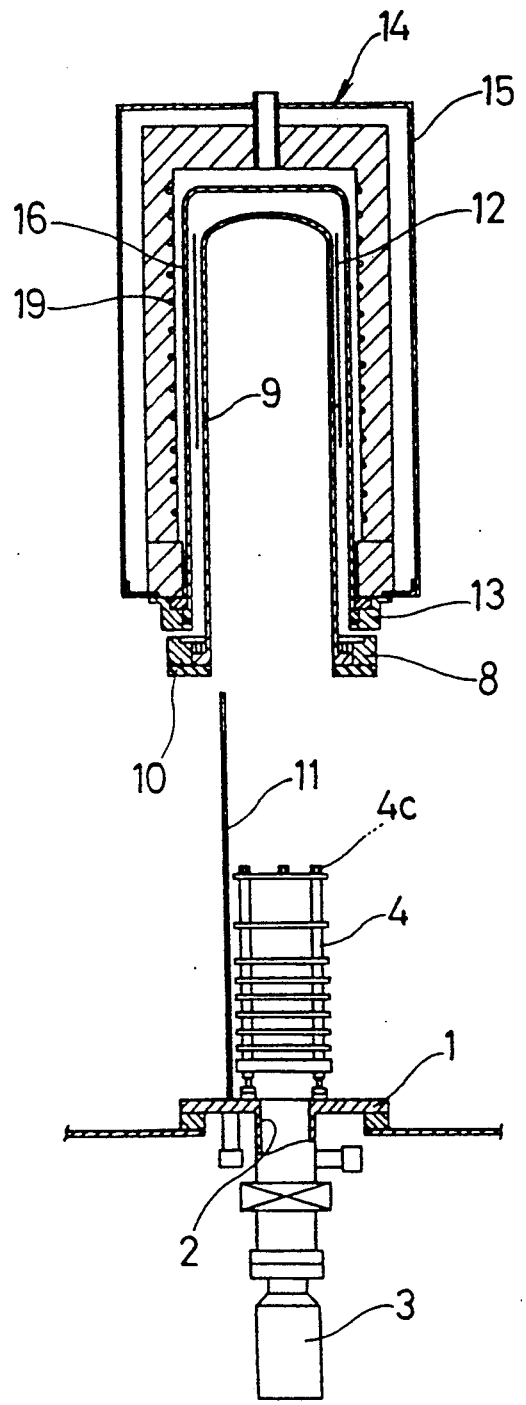
FIG. 3 is a vertical cross-sectional view of the heating apparatus with both the heating device and the reaction chamber being shown as lifted.

After the workpieces W have been heated, the reaction chamber 9 and the heating device 14 are lifted as shown in FIG. 3, and the workpiece holder 5 with the cured workpieces W is removed from the support frame 4.

Then, a new workpiece holder 5 with new workpieces W to be cured is placed on the support frame 4. Subsequently, the reaction chamber 9 is lowered over the workpiece holder 5 and the support frame 4, as shown in FIG. 4. With the heating device 14 remaining in its lifted position, the reaction chamber 9 is evacuated by the evacuating device 3a through the pipe 3, thereby evaporating the solvent contained in the coated wet film on the workpieces W. Inasmuch as the heating device 14 does not cover the reaction chamber 9 at this time, the temperature in the reaction chamber 9 is kept at a level low enough not to start a condensation reaction in the coated wet film on the workpieces W.

Since the reaction chamber 9 is vertically movable with respect to the workpiece holder 5, the cycle time of each curing cycle can be shortened. As the heating device 14 is also vertically movable independently of the reaction chamber 9, the temperature in the reaction chamber 9 can rapidly be lowered. This allows the solvent contained in the coated wet film on the workpieces W to be evaporated away at a temperature of about 200° C. that is low enough not to cause a condensation reaction. Accordingly, the films on the workpieces W as processed according to the invention are relatively high in mechanical strength.

The heater segments 19a, 19b, 19c are independently controllable, and the workpiece holder 5 is positioned on the support frame 4 on the base plate 1. Therefore, the workpieces W can be heated at uniform temperature according to the invention.

The electrodes 12 connected to the high-frequency power supply 12a and disposed around the reaction chamber 9 are capable of generating a plasma in the reaction chamber 9. When the workpieces W are heated in the plasma thus generated, the mechanical strength of the films on the workpieces W may further be increased.

Although there has been described what is at present considered to be the preferred embodiment of the invention, it will be understood that the invention may be embodied in other specific forms without departing from the essential characteristics thereof. The present embodiment is therefore to be considered in all respects as illustrative, and not restrictive. The scope of the invention is indicated by the appended claims rather than by the foregoing description.

What is claimed is:

1. A heating apparatus for curing films coated on workpieces, the apparatus comprising:
   a base plate having an opening defined therein which is connected to an evacuating device;
   a workpiece holder disposed over said opening for holding workpieces;
   a reaction chamber vertically movable with respect to said baseplate between a lowered position in which said reaction chamber defines a closed space which accommodates the workpieces therein and a lifted position in which the workpieces are exposed out of the reaction chamber;
   a heating device vertically movable with respect to said base plate between a lowered position in which the heating device surrounds said reaction chamber for heating the reaction chamber to cure films coated on the workpieces and a lifted position in which said reaction chamber is exposed out of the heating device;
   means for vertically moving said reaction chamber with respect to said workpiece holder between said lowered and lifted positions of the reaction chamber; and
   means for vertically moving said heating device independently of said reaction chamber between said lowered and lifted positions of said heating device.

2. A heating apparatus according to claim 1, wherein said heating device comprises a plurality of vertically spaced, independently controllable heater segments and means for independently controlling said heater segments to achieve a single, substantially uniform temperature distribution about said workpiece holder in said reaction chamber.

3. A heating apparatus according to claim 2, wherein said heating device further comprises means for independently controlling said heater segments, said heater control means is adapted to energize said heater segments with more electric energy in the lower region of said heating device than in an upper region thereof.

4. A heating apparatus according to claim 1, further comprising a support frame mounted on said base plate, said workpiece holder being mounted on said support frame such that the workpiece holder is disposed in an upper portion of said reaction chamber and said support frame is disposed in a lower portion of said reaction chamber when said reaction chamber is in its lowered position.

5. A heating apparatus according to claim 3, wherein said workpiece holder is removably mounted on said support frame.

6. A heating apparatus according to claim 4, wherein said support frame comprises a plurality of vertical support columns mounted on said base plate and a plurality of vertically spaced horizontal plates attached to said vertical support columns.

7. A heating apparatus according to claim 6, wherein said horizontal plates are spaced more widely in an upper region of said support frame than in a lower region thereof.

8. A heating apparatus according to claim 4, wherein said support frame has positioning teeth on an upper surface thereof.

9. A heating apparatus according to claim 8, wherein said workpiece holder has collars on a lower surface thereof which are fittable over said positioning teeth, respectively.

10. A heating apparatus according to claim 8, wherein one of said positioning teeth has a different length or diameter than the other positioning teeth.

11. A heating apparatus according to claim 1, further comprising electrodes disposed around said reaction chamber and connected to a high-frequency power supply.

12. A heating apparatus according to claim 1, wherein said workpiece holder comprises four vertical support columns positioned respectively at the vertices of a trapezoidal shape in a horizontal plane, each of said vertical support columns having a plurality of vertically spaced grooves defined therein.

13. A heating apparatus according to claim 1, wherein said means for vertically moving said reaction chamber comprises a vertically movable arm and an annular seal attached to a lower surface of said arm, said reaction chamber having a lower end placed on an upper surface of said annular seal for vertical movement in unison with said arm.

14. A heating apparatus according to claim 1, further comprising a thermocouple having an end mounted on said base plate, said thermocouple being positioned in said closed space defined by said reaction chamber when is in said lowered position.

15. A heating apparatus according to claim 1, wherein said heating device comprises an outer case, an inner case disposed in said outer case, thermal insulation disposed between said outer case and said inner case, and a heating element positioned on an inner circumferential surface of said thermal insulation.

16. A heating apparatus according to claim 15, further comprising a cooling duct through which a space between said thermal insulation and said inner case communicates with an outer space surrounding said heating device.

17. A heating apparatus for heating workpieces to cure films coated on the workpieces, the apparatus comprising:
   holder means for holding the workpieces;
   a reaction chamber for accommodating said holder means with the workpieces held thereby, said reaction chamber being movable to a position in which the workpieces are exposed out of the reaction chamber;
   electrode means disposed around said reaction chamber for generating a plasma in the reaction chamber;
   heater means for heating said reaction chamber in covering relationship thereto to cure films coated on the workpieces, said heater means being movable to a position in which the reaction chamber is exposed out of the heater means;
   means for vertically moving said reaction chamber with respect to said holder means; and means for vertically moving said heater means with respect to said reaction chamber independently of said reaction chamber moving means.

18. A heating apparatus according to claim 17, further comprising evacuating means for evacuating said reaction chamber while said holder means with the workpieces held thereby is accommodated in said reaction chamber.

19. A heating apparatus according to claim 17, further comprising a base plate, said holder means being removably supported on said base plate, said reaction chamber being movable away from said base plate to said position in which the workpieces are exposed and said heater means being movable away from said base plate to said position in which the reaction chamber is exposed.

20. A heating apparatus according to claim 19, further comprising evacuating means for evacuating said reaction chamber through said base plate while said holder means with the workpieces held thereby is accommodated in said reaction chamber.

21. A heating apparatus according to claim 17, further comprising a base plate and a support frame mounted on said base plate, said holder means being removably mounted on said support frame such that said holder means is disposed within an upper portion of said reaction chamber and said support frame is disposed within a lower portion of said reaction chamber when said reaction chamber accommodates said holder means.

22. A heating apparatus according to claim 17, wherein said heater means comprises a plurality of independently controllable heater segments disposed in spaced regions, respectively, and means for independently controlling said heater segments to achieve a single, substantially uniform temperature distribution about said holder means in said reaction chamber.

23. A heating apparatus according to claim 17, wherein said heater means comprises an outer case, an inner case disposed in said outer case, thermal insulation disposed between said outer case and said inner case, and a heating means positioned on an inner circumferential surface of said thermal insulation.

24. Apparatus for curing films on workpieces, comprising:

holder means for holding workpieces having films coated thereon;

a reaction chamber for accommodating said holder means with the workpieces held thereby;

means for evacuating the reaction chamber to dry the coated films on the workpieces;

heater means for heating said reaction chamber in covering relationship thereto to cure the dried, coated films on the workpieces; and means for vertically moving said reaction chamber and said heater means between lowered positions in which the reaction chamber and heater means are disposed about the holder means and lifted positions in which said reaction chamber and said heater means are not disposed about said holder means, said moving means being adapted to move said reaction chamber and said heater means independently of each other.

25. Apparatus according to claim 24, including:

a base plate having an opening defined therein, the evacuating means being fixed to said base plate and being adapted to evacuate said reaction chamber through said opening in the base plate; and said evacuating means being adapted to evacuate said reaction chamber at a relatively low temperature below a temperature to which said reaction chamber is heated by said heating means.

* * * * *

UNITED STATES PATENT AND TRADEMARK OFFICE
CERTIFICATE OF CORRECTION

PATENT NO. : 5,332,557
DATED : July 26, 1994
INVENTOR(S) : Sahoda et al.

It is certified that error appears in the above-indentified patent and that said Letters Patent is hereby corrected as shown below:

Column 2, line 50, change "4b." (second occurrence) to -- 4a. --;

Column 2, line 51, change "4a" to --4b--.

Column 2, line 63, change "Jointly" to --jointly--.

Column 3, line 3, change "Joined" to --joined--;

Column 3, line 30, change "Jointly" to --jointly--.

Column 4, line 8, delete "the" (first occurrence).

Signed and Sealed this

Eleventh Day of October, 1994

Attest:

BRUCE LEHMAN

*Attesting Officer*      *Commissioner of Patents and Trademarks*